(12) United States Patent
Watanabe et al.

(10) Patent No.: US 10,737,345 B2
(45) Date of Patent: Aug. 11, 2020

(54) PIPE JOINT, FLUID CONTROL DEVICE, FLUID CONTROL UNIT, SEMICONDUCTOR FABRICATION APPARATUS AND METHOD OF FORMING PIPE JOINT

(71) Applicant: FUJIKIN INCORPORATED, Osaka (JP)

(72) Inventors: Kazunari Watanabe, Osaka (JP); Toshiyuki Inada, Osaka (JP); Tsutomu Shinohara, Osaka (JP); Tomohiro Nakata, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 352 days.

(21) Appl. No.: 15/752,464

(22) PCT Filed: Jul. 14, 2016

(86) PCT No.: PCT/JP2016/070883
§ 371 (c)(1),
(2) Date: Feb. 13, 2018

(87) PCT Pub. No.: WO2017/038274
PCT Pub. Date: Mar. 9, 2017

(65) Prior Publication Data
US 2019/0009353 A1 Jan. 10, 2019

(30) Foreign Application Priority Data

Aug. 28, 2015 (JP) .................................. 2015-169186

(51) Int. Cl.
*B23K 9/028* (2006.01)
*F16L 55/115* (2006.01)
(Continued)

(52) U.S. Cl.
CPC ............ *B23K 9/028* (2013.01); *B23K 9/0282* (2013.01); *B23K 9/167* (2013.01); *B23K 9/23* (2013.01);
(Continued)

(58) Field of Classification Search
CPC ...... B23K 9/028; B23K 9/0282; B23K 9/167; B23K 9/23; F16L 13/02; F16L 55/115; H01L 21/3065
(Continued)

(56) References Cited

FOREIGN PATENT DOCUMENTS

| JP | H07-174232 A | 7/1995 |
| JP | 2004-074086 A | 3/2004 |
| WO | 2007/017937 A1 | 2/2007 |

OTHER PUBLICATIONS

International Search Report from Patent Application No. PCT/JP2016/070883, dated Oct. 11, 2016.
(Continued)

*Primary Examiner* — Jennifer C Chiang
(74) *Attorney, Agent, or Firm* — Greenblum & Bernstein, P.L.C.

(57) ABSTRACT

A pipe joint includes a first member, a second member, a weld experiencing transverse contraction and joining a first outer cylindrical end portion and a second outer cylindrical end portion butted with their end faces meeting over the entire circumference, an annular sealed area produced by the transverse contraction of the weld causing a first pressing portion and a second pressing portion to be displaced toward each other, a heat transmission suppressing member arranged in a space delimited by a weld forming area and a to-be-sealed area, inside the first and second members assembled, to suppress transmission of heat applied in welding from the weld forming area to a to-be-sealed area, and a first stop ring fitted in an outer cylindrical surface of
(Continued)

the heat transmission suppressing member to hold the heat transmission suppressing member against an inner surface of the first or the second member.

14 Claims, 5 Drawing Sheets

(51) Int. Cl.
  *B23K 9/167* (2006.01)
  *B23K 9/23* (2006.01)
  *F16L 13/02* (2006.01)
  *F16L 55/11* (2006.01)
  *H01L 21/3065* (2006.01)
  *B23K 101/04* (2006.01)
  *B23K 101/00* (2006.01)
  *B23K 103/04* (2006.01)

(52) U.S. Cl.
  CPC ............... *F16L 13/02* (2013.01); *F16L 55/11* (2013.01); *F16L 55/115* (2013.01); *H01L 21/3065* (2013.01); *B23K 2101/006* (2018.08); *B23K 2101/04* (2018.08); *B23K 2103/05* (2018.08)

(58) Field of Classification Search
  USPC .................................................. 219/60.2, 61
  See application file for complete search history.

(56) References Cited

OTHER PUBLICATIONS

International Preliminary Report on Patentability from Patent Application No. PCT/JP2016/070883, dated Mar. 6, 2018.

PIPE JOINT, FLUID CONTROL DEVICE, FLUID CONTROL UNIT, SEMICONDUCTOR FABRICATION APPARATUS AND METHOD OF FORMING PIPE JOINT

TECHNICAL FIELD

The present invention relates to a pipe joint, a fluid control device, a fluid control unit, a semiconductor fabrication apparatus and a method of forming a pipe joint.

BACKGROUND ART

Patent Document 1 discloses a method of sealing a pipe joint in which a plate-like metal sealing member is interposed and secured between two metal pipe members. In this sealing method, by welding the two metal pipe members in an area ensuring that heat applied in welding does not influence the metal sealing member, a weld contracting in a direction causing the metal sealing member to be secured between the two pipe members is formed. As a result of deformation of the metal pipe members caused by the contraction of the weld, the sealing member is secured, and thus, air-tightly held between the two metal pipe members.

PRIOR ART DOCUMENT

Patent Document

Patent Document 1: Japanese Unexamined Patent Application Publication No. Hei 7-174232

SUMMARY OF THE INVENTION

Problems to be Solved by the Invention

In the above prior-art technology, the metal sealing member is in the shape of a plate extending in the pipe members' diametrical direction, which may lead to increased size of the pipe joint.

Further, in this prior-art technology, considering the risk that heat applied in welding will influence the metal sealing member, a weld forming area and an area to be sealed by the metal sealing member are separated by a space of L-shaped, zigzag cross-section to suppress transmission of heat form the weld forming area to the to-be-sealed area. However, providing a space of such complex shape leads to a further increase in the diametrical size of the pipe joint.

In welding, scale is formed on the weld, and such scale needs to be removed by descaling operation. In particular, scale formed on the inner side of the weld decreases the corrosion resistance of the pipe joint, and molten metal separated from the scale may become floating particles and fall into a flow passage extending inside the pipe joint. Thus, descaling operation for removing scale from the inner side of the weld needs to be conducted soundly.

However, in the pipe joint according to the above prior-art technology, the inner side the weld faces the narrow space of L-shaped cross-section, so that it is difficult to access the inner side of the weld and remove scale therefrom. Thus, the application of this pipe joint is limited to structures that allow descaling by electropolishing or the like. Further, the efficiency of descaling operation by electropolishing that can achieve the same level of smoothness of the inner surface of the weld as achieved by physical polishing is low. Furthermore, in descaling by electropolishing or the like, it is difficult to remove a polishing solution and clean the interior of the pipe joint because a narrow passage formed between the welded pipe members is likely to be clogged. Cleaning takes a lot of trouble.

It is conceivable to prevent the formation of scale by spraying the weld forming area with inert gas. However, the application of this method is limited to structures in which a space surrounding the weld forming area can be sealed and gas in the sealed space can be replaced easily. This may reduce the freedom of pipe member design as well as pipe joint design. Further, this method requires sealing and gas replacement operation, or in other words, operation taking a lot of trouble is required prior to welding, which may reduce the efficiency of producing the pipe joint.

Suppose that removal of scale from the inner side of the weld is insufficient so that particles of molten metal separated from the scale fall into the flow passage extending inside the pipe joint. If the pipe joint is included in a semiconductor fabrication apparatus, the particles flow into a chamber (reactor), which leads to a reduced yield. Thus, the demand for a pipe joint in which a liquid is reliably prevented from contacting a weld, a fluid control device using such pipe joint and a fluid control unit including such fluid control device is becoming greater than before, particularly for semiconductor fabrication apparatuses.

The present invention has been made in view of the above problems. An object thereof is to provide a pipe joint, a flow control device, a flow control unit and a semiconductor fabrication apparatus which are easy to construct, exhibit high sealing performance, can be realized in a reduced size, can be produced efficiently, provide high reliability and allow great freedom of design, and a method of forming such pipe joint.

Means for Solving the Problems

In order to achieve the above object, a pipe joint according to the present invention as well as a pipe joint for use in a fluid control device, a fluid control unit and a semiconductor fabrication apparatus according to the present invention comprises a first member having a first outer cylindrical end portion at an end and a first pressing portion located inside the first outer cylindrical end portion; a second member having a second outer cylindrical end portion at an end and a second pressing portion located inside the second outer cylindrical end portion; a fluid flow passage formed to extend at least either inside the first pressing portion or inside the second pressing portion; a weld experiencing transverse contraction and joining together the first and the second outer cylindrical end portions, formed by butting the first and the second outer cylindrical end portions with their end faces meeting over the entire circumference and performing welding at the outer circumferential edge of the meeting end faces; an annular sealed area produced between the first and second pressing portions by the transverse contraction of the weld causing the first and the second pressing portions to be displaced toward each other; a heat transmission suppressing member arranged in a space delimited by a weld forming area and a to-be-sealed area, inside the first and second members assembled, to suppress transmission of heat applied in welding from the weld forming area to the to-be-sealed area; and a first stop ring fitted in an outer cylindrical surface of the heat transmission suppressing member to hold the heat transmission suppressing member against an inner surface of the first or the second member.

A method of forming a pipe joint according to the present invention comprising a first member having a first outer cylindrical end portion at an end and a first pressing portion located inside the first outer cylindrical end portion, a second member having a second outer cylindrical end portion at an end and a second pressing portion located inside the second outer cylindrical end portion, a fluid flow passage formed to extend at least either inside the first pressing portion or inside the second pressing portion, and a heat transmission suppressing member arranged inside the first and the second members assembled comprises: forming a weld experiencing transverse contraction and joining the first and the second outer cylindrical end portions, by butting the first and the second outer cylindrical end portions with their end faces meeting over the entire circumference and performing welding at the outer circumferential edge of the meeting end faces; the transverse contraction of the weld causing the first and second pressing portions to be displaced toward each other, thereby producing an annular sealed area between the first and the second pressing portions; and the heat transmission suppressing member suppressing transmission of heat applied in welding from a weld forming area to a to-be-sealed area in a space delimited by the weld forming area and the to-be-sealed area.

Advantageous Effects of the Invention

The present invention can provide a pipe joint, a flow control device, a flow control unit and a semiconductor fabrication apparatus which are easy to construct, exhibit high sealing performance, can be realized in a reduced size, can be produced efficiently, provide high reliability and allow great freedom of design, and a method of forming such pipe joint.

MODE OF CARRYING OUT THE INVENTION

With reference to the accompanying drawings, a block valve 1 having a pipe joint according an embodiment of the present invention will be described.

Figure 1:
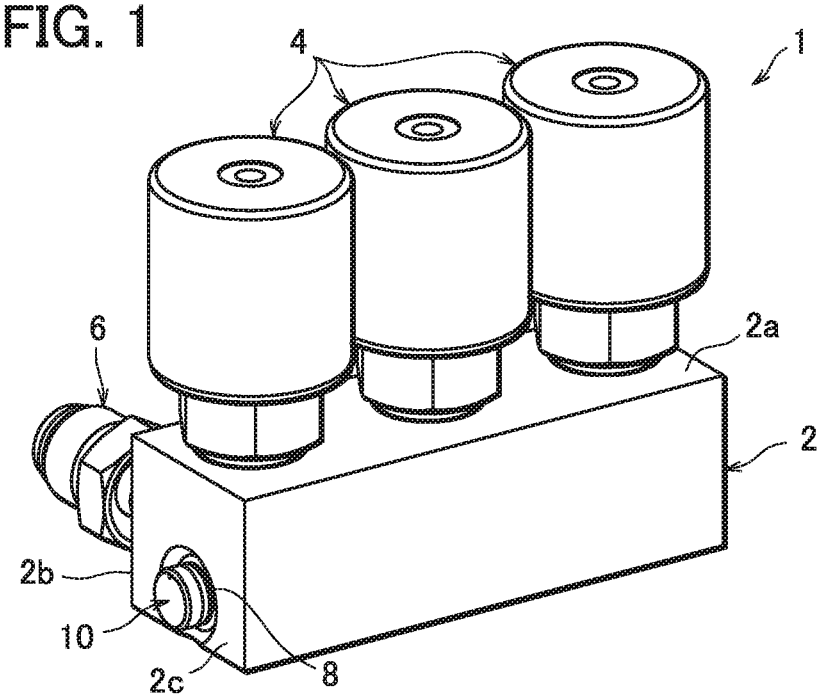
FIG. 1 is a perspective view of a block valve which is an embodiment of fluid control device according to the present invention.

As shown in FIG. 1, the block valve 1 comprises a body 2 (first member) which is a valve body of cuboidal shape made of metal (stainless steel, for example), three actuators 4 connected to the top face 2a of the body 2, three pipe members 6 connected to the rear face 2b of the body 2 (of the three, only one is shown), and a closure cap (second member) 10 joined to the left-side face 2c of the body 2 by a weld 8. Here, the directional terms "top", "rear", "left-side" are used with reference to FIG. 1.

Each actuator 4 includes a driver, not shown, and controls flow rate of a fluid by moving a valve element, not shown, in a valve chamber, not shown, formed in the body 2.

Figure 2:
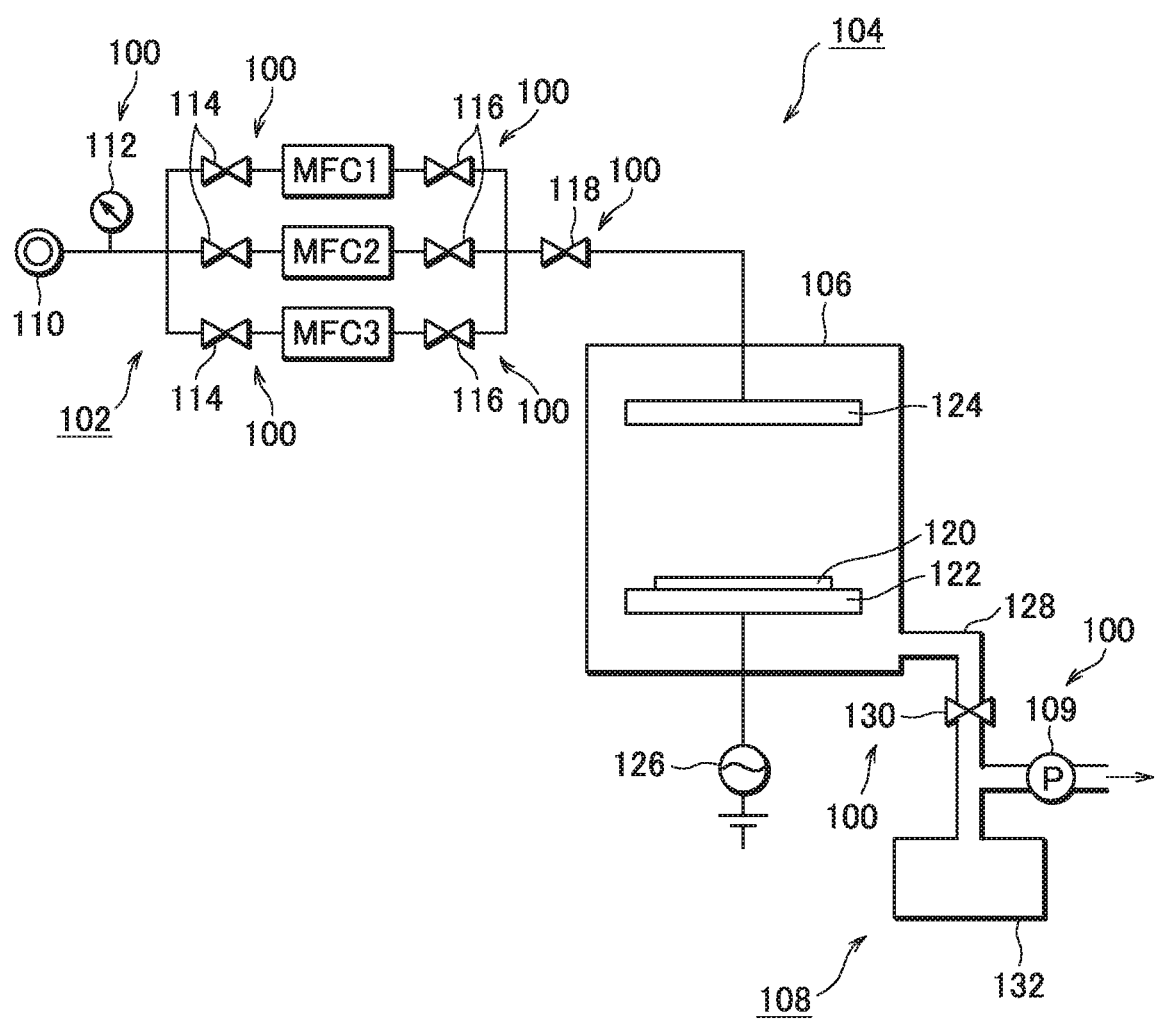
FIG. 2 is a diagram schematically showing a fluid control device, or block valve of FIG. 1, a fluid control unit and a semiconductor fabrication apparatus.

FIG. 2 is a diagram schematically showing a semiconductor fabrication apparatus 104, which comprises a fluid control unit 102, which comprises fluid control devices 100 including block valves 1. The semiconductor fabrication apparatus 104 is, for example a CVD apparatus, which comprises a fluid control unit 102 serving as a gas supply means, a vacuum chamber 106, an exhaust means 108 and so on to form a passive film (oxide film) on a wafer 120 described later.

In the description of the present embodiment, the term "flow control device 100" may be used to indicate any of devices which constitute the semiconductor fabrication apparatus 104 and relate to control of a fluid, including a pressure gauge 112, a block valve 1 incorporating on/off valves 114, a block valve 1 incorporating on/off valves 116, on/off valves 118, 130, and MFCs (mass flow controllers) 1 to 3, or alternatively used as a generic term for those devices.

The flow control unit 102 is a device which regulates the flow rate, etc. of a gas to be supplied from a gas supply source 110 to the vacuum chamber 106, and comprises a pressure gage 112, on/off valves 114, 116 and MFCs 1 to 4. Between the flow control unit 102 and the vacuum chamber 106, an on/off valve 118 is provided. The vacuum chamber 106 comprises a table 122 on which a wafer 120 is placed and an electrode 124 to form a thin film on the water 120. The vacuum chamber 106 is electrically connected to a commercial power supply 126. The exhaust means 108 comprises exhaust piping 128, an on/off valve 130, a dust collector 132 and a vacuum pump 109.

In forming a thin film on the wafer 120, supply of a gas to the vacuum chamber 106 is controlled by operations of the on/off valves 114, 116, the MFCs 1 to 3 and the on/off valve 118. When removing powder particles which are by-products produced in forming a thin film on the wafer 120, the on/off valve 130 is opened to allow the powder particles to flow in the exhaust piping 128 to the dust collector 132, where they are removed.

The flow control device 100 [sic] includes three pairs of on/off valves 114, 116, where the on/off valves 114 are incorporated into a block valve 1 and the on/off valves 116 are incorporated into a block valve 1. Each block valve 1 is connected to the fluid control device 100 [sic] by the pipe members 6 shown in FIG. 1, where a connecting method, such as welding or screwing, can be employed. The on/off valves 114 constituting a block valve 1, the on/off valves 116 constituting a block valve 1, and the on/off valves 118, 130 are small in size, which allows the flow control unit 102 to be small in size.

The fluid control unit 102 small in size is suited to be used in a semiconductor fabrication apparatus 104 of which downsizing is demanded, and thus, serves to realize a so-called minimal-fab apparatus, or small-sized semiconductor fabrication apparatus for fabricating small-diameter wafers experimentally for test and research. Such minimal-fab apparatus requires only a smaller installation area within a clean room, thus reduces the cost of running the clean room and allows trial wafers for fabricating a variety of semiconductor devices to be obtained at low cost.

Figure 3:
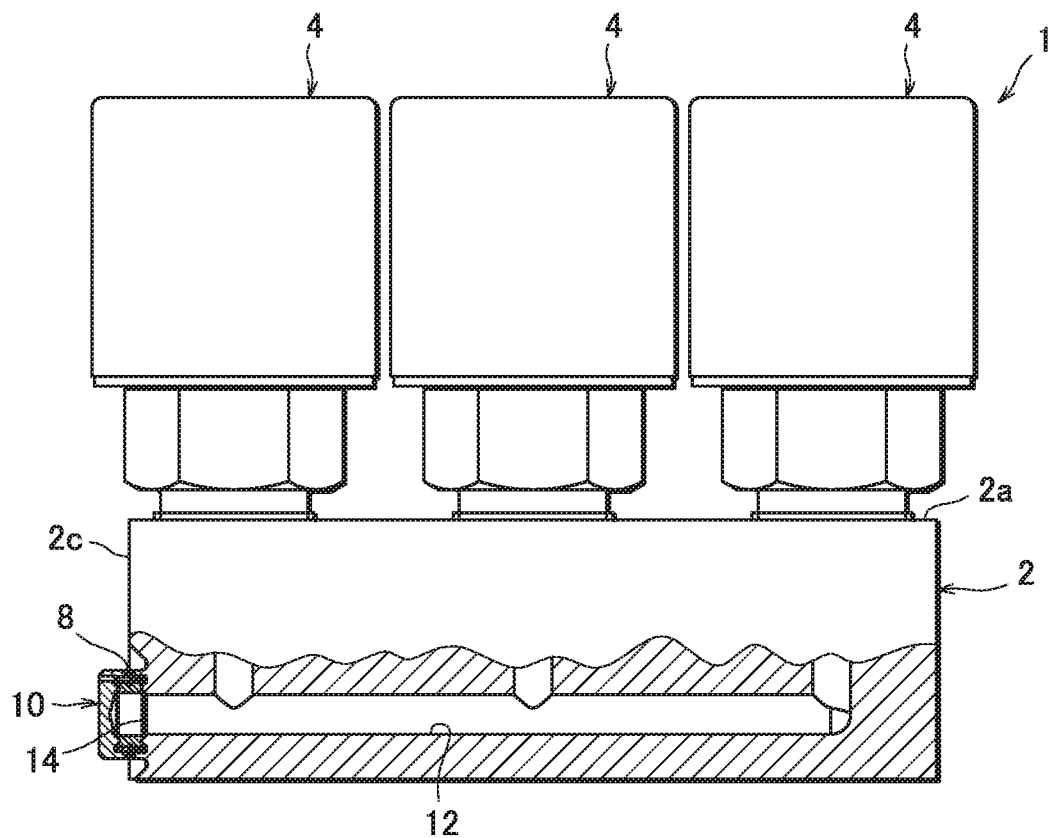
FIG. 3 is a partly cross-sectional diagram of the block valve of FIG. 1.

As shown in FIG. 3, in the body 2 is bored a flow passage 12 for a fluid, which is in communication with valve chambers. The pipe members 6 are in communication with flow passages, not shown, which are in communication with the flow passage 12, and thus, with the valve chambers, so that the fluid enters or exits the block valve 1 such that it flows from the pipe members 6 into the valve chambers via the fluid passages or vice versa.

Further, the body 2 has an opening 14 in the left-side end face 2c. The opening 14 is formed when the flow passage 12 is bored in the body 2 to extend along the row of the actuators 4, using a tool such as a drill. The opening is closed with a closure cap 10. In the present embodiment, the closure cap 10 is a component to be joined to the body 2 of the block valve 1 by forming a pipe joint.

Figure 4:
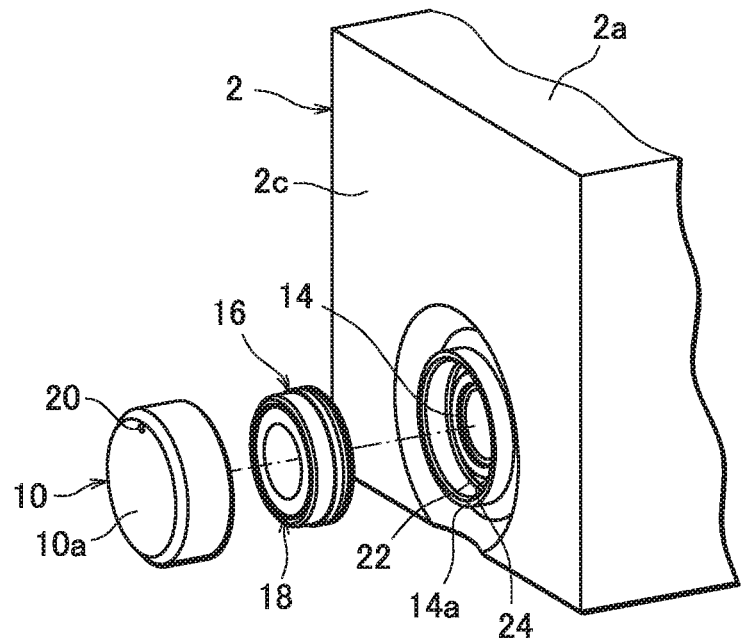
FIG. 4 is an exploded perspective view showing part of a body of the block valve of FIG. 1, a closure cap, and a heat transmission suppressing member.
Figure 5:
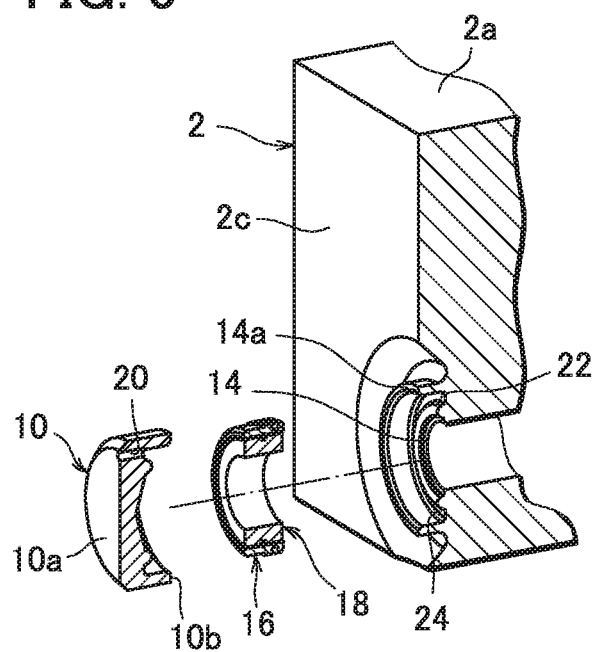
FIG. 5 is an exploded cross-sectional perspective view showing the components shown in FIG. 4.

As shown in FIGS. 4 and 5, the closure cap 10 is a cap-shaped component made of metal (stainless steel, for example). The closure cap 10 has a communication hole 20 in a bottom wall 10a. An annular heat transmission suppressing member 16 made of metal (stainless steel, for example) is attached to an outer cylindrical end portion (first outer cylindrical end portion) 14a formed in the body 2 to surround the opening 14, and then, the closure cap 19 is joined to the body 2 by welding. To the inner side of the heat transmission suppressing member 10, a separate, annular gasket (sealing member) 18 made of metal (stainless steel, for example) is attached in advance.

Figure 6:
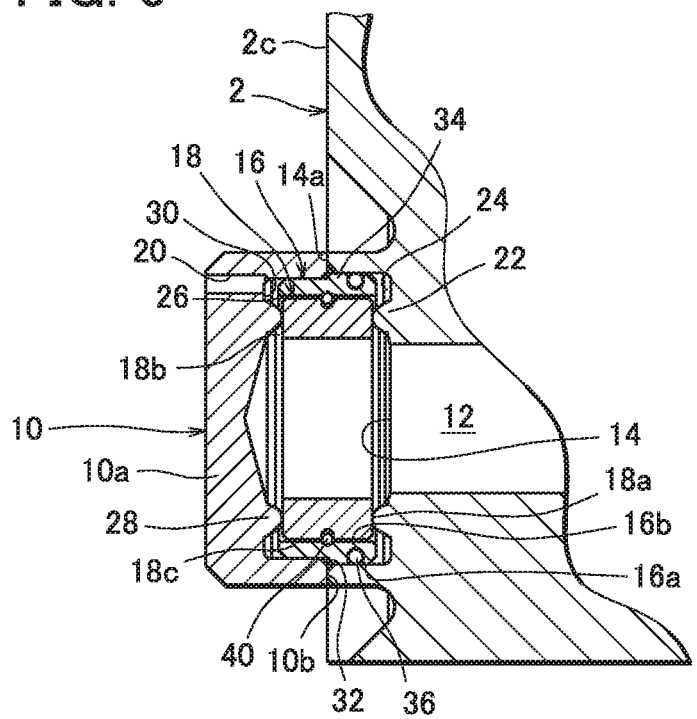
FIG. 6 is a cross-sectional view showing the closure cap and the body of the block valve of FIG. 5 assembled before welding.

As seen also in FIG. 6, inside the outer cylindrical end portion 14a, the body 2 has an annular projection (first pressing portion) 22 formed to project to the same side as the outer cylindrical end portion 14a projects. The annular projection 22 forms a rim of the opening 14, and thus, the flow passage 12 is located inside the annular projection 22. Between the outer cylindrical end portion 14a and the annular projection 22 of the body 2 is defined an annular recess 24. The annular recess 24 provides part of a space 26 in which the heat transmission suppressing member 16 is arranged. The closure cap 10 is attached with the communication hole 20 in communication with the space 26.

The closure cap 10 has an outer cylindrical end portion (second outer cylindrical end portion) 10b at an end, which projects from the bottom wall 10a. Inside the outer cylindrical end portion 10b, the closure cap 10 has an annular projection (second pressing portion) 28 formed to project to the same side as the outer cylindrical end portion 10b projects. Inside the annular projection 28, an extension of the flow passage 12 is defined, so that the flow passage 12 bored in the body 2 is extended up to the bottom wall 10a of the closure cap 10. Between the outer cylindrical end portion 10b and the annular projection 28 is defined an annular recess 30. The annular recess 30 provides part of the above-mentioned space 26 in which the heat transmission suppressing member 16 is arranged.

Next, with reference to FIGS. 6 and 7, how the heat transmission suppressing member 16 is attached to the body 2 of the block valve 1 and how the closure cap 10 is welded thereto will be described.

As shown in FIG. 6, first, the heat transmission suppressing member 16 with the gasket 18 attached inside is fitted in the annular recess 24 in the body 2. Then, the closure cap 10 is attached to the body 2 with the outer cylindrical end portion 10b pressed against the outer cylindrical end portion 14a, where the outer cylindrical end portion 10b of the closure cap 10 and the outer cylindrical end portion 14b of the body 2 are butted with their end faces meeting over the entire circumference. Since the gasket 18 is attached to the inside of the heat transmission suppressing member 16 in advance, the gasket 18 is protected and prevented from becoming harmed in assembling.

In the outer cylindrical face 16a of the heat transmission suppressing member 16 is fitted a stop ring (first stop ring) 36. The stop ring 36 is a C-shaped spring, and fitted in a groove formed in the outer cylindrical face 16a to exert a repulsive force, thereby holding the heat transmission submission member 16 against the inner surface of the outer cylindrical end portion 14a of the body 2, thus preventing the heat transmission suppressing member 16 from falling off the body 2. Further, since the outer cylindrical end portion 14a of the body 2 is in contact with the heat transmission suppressing member 16 with the stop ring 36 interposed between them, direct transmission of heat from a weld 8 forming area to the heat transmission suppressing member 16 is suppressed.

The inner surface of the heat transmission suppressing member 16 includes a guide surface 16b. The guide surface 16b guides the gasket 18 when the gasket is inserted in the heat transmission suppressing member 16.

In the outer cylindrical face 18c of the gasket 18 is fitted a stop ring (second stop ring) 40. Like the stop ring 36, the stop ring 40 is a C-shaped spring, and fitted in a groove formed in the outer cylindrical face 18c to hold the gasket 18 against the guide surface 16b of the heat transmission suppressing member 16, thus preventing the gasket 18 from falling off the heat transmission suppressing member 16. Further, since the outer cylindrical surface 18c of the gasket 18 is in contact with the heat transmission suppressing member 16 with the stop ring 40 interposed between them, direct transmission of heat from the heat transmission suppressing member 16 to the gasket 18 is suppressed.

In the present embodiment, the outer cylindrical end portion 10b of the closure cap 10 is smaller in inside diameter than the outer cylindrical end portion 14a of the body 2. Thus, the cylindrical wall formed by the butted outer cylindrical end portions 10b, 14a, which delimits the space 26, has a step 32. The heat transmission suppressing member 16 includes an enlarged diameter portion 34 with an outwardly-projecting outer cylindrical surface portion 16a. In attaching the heat transmission suppressing member 16 to the body 2, the heat transmission suppressing member 16 is placed in position within the space 26 with the enlarged diameter portion 34 seated on the step 32.

Figure 7:
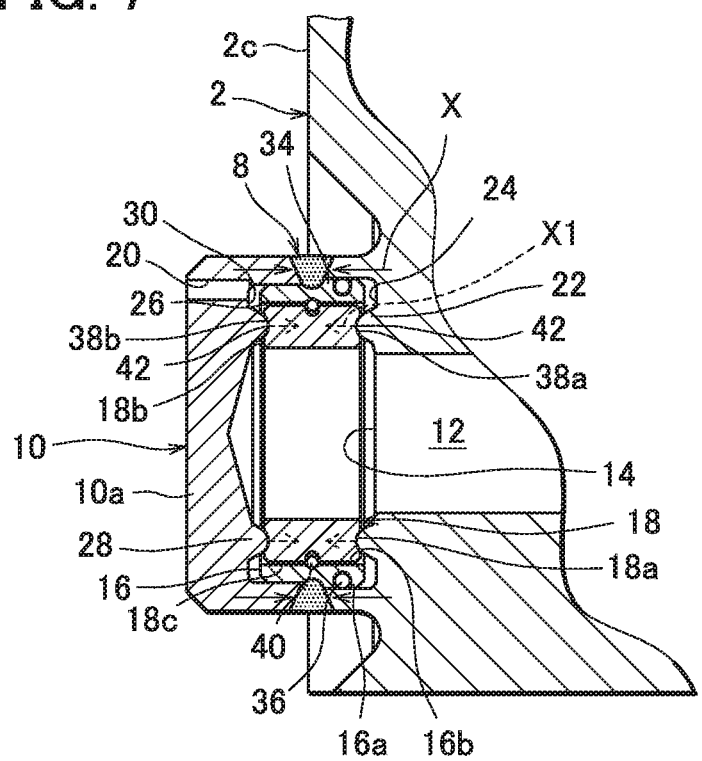
FIG. 7 is a cross-sectional view showing the closure cap and the body of the block valve of FIG. 5 welded together.

Next, with the outer cylindrical end portion 10a of the closure cap 10 pressed against the outer cylindrical end portion 14a of the body 2, the outer cylindrical end portion 10a of the closure cap 10 and the outer cylindrical end portion 14a of the body 2 are welded over the entire circumference of their meeting end faces, so that the closure cap 10 and the body 2 are joined together by the weld 8 formed in the block valve 1, as shown in FIG. 7.

Here, before forming the weld 8, when the outer cylindrical end portion 10a of the closure cap 10 and the outer cylindrical end portion 14a of the body 2 are butted with their end faces meeting over the entire circumference, the outer circumferential edge of the meeting end faces defines a contact circle. The weld 8 may be formed in a manner such that first, point welds are formed at two points which are on the contact circle and opposite with respect to the center of the contact circle, and then the weld 8 is formed by performing welding over the entire circumference of the contact circle. This ensures that the weld 8 is formed with the outer cylindrical end portion 10a pressed against and kept in contact with the outer cylindrical end portion 14a over the entire circumference, and thus with the closure cap 10 kept in position relative to the body 2. The weld 8 may be formed in a manner such that first, point welds are formed at two points which are on the contact circle and opposite with respect to the center, then point welds are formed at two points which are on the contact circle and 90° apart from the former two points, respectively, and then the weld 8 is formed.

The weld 8 expands when heated in welding and contracts when cooled after welding. Specifically, as indicated by solid-line arrows X along the flow passage 12, the weld 8 experiences transverse contraction, or contraction approximately perpendicular to the welding line along which the weld 8 is formed. The transverse contraction of the weld 8 causes the annular projection 22 of the body 2 and the annular projection 28 of the closure cap 10 to be displaced toward each other with the gasket 18 interposed between them, as indicated by broken-line arrows X1, thereby pressing the annular projections to the gasket 18.

In the present embodiment, the hardness of the gasket 18 is lowered by heat treatment or the like to be lower than that of the annular projections 22, 28. The annular projections pressed to the gasket 18 therefore form recesses 38*a*, 38*b* in the annular end faces 18*a*, 18*b* of the gaskets 18, respectively. Thus, annular sealed areas 42 are produced by plane contact between the annual projection 22 of the body 2 and the annular end face 18*a* and plane contact between the annular projection 28 of the closure cap 10 and the annular end face 18*b*, respectively. In other words, in the present embodiment, annular sealed areas 42 are produced by means of the gasket 18 to which the annular projection 22 of the body 2 and the annular projection 28 of the closure cap 10 are pressed by the transverse contradiction of the weld 8, at the opposite sides of the gasket.

In the block valve 1, the weld 8 and the sealed areas 42 delimit the above-mentioned space 26, and the heat transmission suppressing member 16 is arranged in the space 26. The sealed areas 42 border on the space 26, and the space 26 is in communication with outside via the communication hole 20. Thus, after the weld 8 and the sealed areas 42 are produced, the communication hole 20 serves as a leak port (leak passage) for checking a leak of a fluid at the sealed areas 42, using helium gas or the like.

As understood from the above description, the present embodiment can provide a pipe joint formed by welding a closure cap 10 to a body 2 of a block valve 1, which pipe joint can be produced efficiently and provides high reliability, a fluid control device 100 in the form of a block valve 1 including such pipe joint, a fluid control unit 2 including such block valve 1, and a semiconductor fabrication apparatus 104 including such fluid control unit 2.

Specifically, the described embodiment of pipe joint, which is formed by welding a body 2 of a block valve 1 and a closure cap 10, comprises a heat transmission suppressing member 16. Thus, transmission of heat applied in welding from a weld 8 forming area to areas 42 to be sealed is reliably suppressed, without the need to separate the weld 8 forming area and the to-be-sealed areas 42 by a space of complex shape. This allows the gasket 18, which produces sealed areas 42, to have a simple annular shape. If the heat transmission suppressing member 16 is made of a material with a low thermal conductivity, such as ceramic or stainless steel, the weld 8 forming area is allowed to be diametrically nearer to the to-be-sealed areas 42, which allows the pipe joint to have a greatly reduced size, particularly a greatly reduced diameter.

Further, the heat transmission suppressing member 16 helps produce highly-reliable sealed areas 42. Thus, the concern that a liquid will contact the weld 8 is removed. This eliminates the need for descaling operation for removing scale from the weld 8 or sealing and gas replacement operation for preventing formation of scale, and thus, greatly increases the efficiency of constructing the pipe joint. Further, the application of this pipe joint is not limited to structures in which sealing and gas replacement operation is easy. The pipe joint thus provides greatly-increased freedom of design.

When this block valve 1 or a fluid control unit 2 including this block valve 1 is used in a semiconductor fabrication apparatus 104, particles of molten metal separated from scale are prevented from falling into the fluid passage 12, reliably.

As seen in FIG. 7, the weld 8 may penetrate into the outer cylindrical surface of the heat transmission suppressing member 16, across the meeting end faces of the outer cylindrical end portion 10*a* of the closure cap 10 and the outer cylindrical end portion 14*a* of the body 2

Desirably, the weld 8 is formed by a welding process, such as TIG welding, which can apply a great amount of heat and melt a great amount of material, and thus, can melt a weld forming area deeply enough to produce a so-called penetration weld. If a penetration weld 8 is produced effectively without hindering downsizing of the pipe joint, a pipe joint which is small in size and exhibits improved sealing performance can be obtained, because the penetration weld experiences greater transvers contraction, which improves sealing performance at the sealed areas 42.

In the above, an embodiment of the present invention has been described. The present invention is however not limited to the described embodiment, to which various alterations can be made without deviating from the essentials of the present invention.

For example, in the described embodiment, the closure cap 10 is a component joined to the body 2 of the block valve 1 by forming a pipe joint, where the pipe joint is formed by welding the closure cap 10 and the body 2 of the block valve 1; the present invention is however not limited to this and applicable when not the closure cap 10 but the above-mentioned pipe member 6 or the like is welded to the block valve 1, when a component such as the pipe member 6 or the closure cap 10 is welded to a body of a valve other than the block valve 1, and when pipe members are welded together.

However, when one of the two members to be welded together is a closure cap 10 for closing an outer cylindrical end portion 14*a* while the other is a body 2 of a block valve 1 having a plurality of valve elements and a flow passage 12 in communication with valve chambers in which the valve elements are arranged, respectively, as in the described embodiment, the present invention is especially advantageous, because removal of scale from the weld 8 is not needed, which greatly increases the efficiency of constructing the pipe joint. More specifically, in the case of the block valve 1, which is a fluid control device incorporating a plurality of valves and thus contributes to downsizing, a flow passage 12 is bored in a block. Thus, when the body 2 of the block valve 1 and the closure cap 10 are welded, it is difficult to physically access the inner side of the weld 8, which makes descaling operation difficult.

In the described embodiment, the weld 8 is produced in the block valve 1 to extend over the entire circumference of the meeting end faces of the outer cylindrical end portions 10*a*, 14*a*. In this case, the weld 8 experiences transverse contraction at the entire circumference of the meeting end faces of the outer cylindrical end portions 10*a*, 14*a*, so that the annular projections 22, 28 are pressed to the annular end faces 18*a*, 18*b* at the entire circumference of each annular end face 18*a*, 18*b*. This improves sealing performance at the sealed areas 42.

However, the present invention is not limited to this. The weld 8 may consist of discrete point welds formed at the outer circumferential edge of the meeting end faces of the outer cylindrical end portions 10b, 14a, as long as such weld can produced sealed areas 42. When the weld 8 is formed of discrete point welds, the risk of producing sealed areas 42 tilted with respect to the diametrical direction of the pipe joint is low as compared with when the weld is formed to extend over the entire circumference. Thus, the weld formed of discrete point welds is more likely to produce sealed areas 42 exhibiting circumferentially-uniform sealing performance.

The shapes of the annular projections 22, 28 and the gasket 18 are not limited to those in the described embodiment. The sealed areas 42 may be produced by linear contact instead of plane contact. Linear contact exerts greater pressure than plane contact. Thus, the sealed areas 42 produced by linear contact may exhibit improved sealing performance.

A sealing area 42 may be produced by contact between the annular projections 22, 28 without the gasket 18. In this case, the pipe joint is formed of a reduced number of components, with a reduced number of assembly steps, and thus, produced more efficiently. Further, when only one sealed area 42 is produced, the risk of a fluid leak is low as compared with when two sealed areas 42 are produced.

A fluid control device 100 in the form of a block valve 1 including a pipe joint formed by welding is applicable to various flow control units for constituting a various fluid circuits, other than the described fluid control unit 102. Further, a fluid control unit 102 including a fluid control device 100 of this type is applicable to various fabrication apparatuses other than the described semiconductor fabrication apparatus 104.

EXPLANATION OF REFERENCE SIGNS

1 Block valve (fluid control device, valve)
2 Body (first member)
4 Actuator (valve element)
8 Weld
10 Closure cap (second member)
10b Outer cylindrical end portion (second outer cylindrical end portion)
12 Flow passage
14a Outer cylindrical end portion (first outer cylindrical end portion)
16 Heat transmission suppressing member
16a Outer cylindrical surface
16b Guide surface
18 Gasket (sealing member)
18c Outer cylindrical surface
22 Annular projection
26 space
28 Annular projection
36 Stop ring (first stop ring)
40 Stop ring (second stop ring)
42 Sealed area
100 Fluid control device (block valve)
102 Fluid control unit

What is claimed is:

1. A pipe joint, comprising
a first member having a first outer cylindrical end portion at an end and a first pressing portion located inside the first outer cylindrical end portion,
a second member having a second outer cylindrical end portion at an end and a second pressing portion located inside the second outer cylindrical end portion,
a fluid flow passage formed to extend at least either inside the first pressing portion or inside the second pressing portion,
a weld experiencing transverse contraction and joining together the first and the second outer cylindrical end portions, formed by butting the first and the second outer cylindrical end portions with their end faces meeting over the entire circumference and performing welding at the outer circumferential edge of the meeting end faces,
an annular sealed area produced between the first and second pressing portions by the transverse contraction of the weld causing the first and the second pressing portions to be displaced toward each other,
a heat transmission suppressing member arranged in a space delimited by a weld forming area and a to-be-sealed area, inside the first and second members assembled, to suppress transmission of heat applied in welding from the weld forming area to the to-be-sealed area, and
a first stop ring fitted in an outer cylindrical surface of the heat transmission suppressing member to hold the heat transmission suppressing member against an inner surface of the first or the second member.

2. The pipe joint according to claim 1, wherein the sealed area is produced by the first and the second pressing members making a contact.

3. The pipe joint according to claim 1, wherein the sealed area is produced by the transverse contraction of the weld causing the first and the second pressing members to be pressed to a sealing member interposed between the first and the second pressing members.

4. The pipe joint according to claim 3, wherein the heat transmission suppressing member has an inner cylindrical surface including a guide surface for guiding the sealing member to be held against the guide surface.

5. The pipe joint according to claim 3, wherein a second ring is fitted in an outer cylindrical surface of the sealing member to hold the sealing member against the guide surface of the heat transmission suppressing member.

6. The pipe joint according to claim 1, wherein one of the first and second members is a closure cap.

7. A fluid control device including a pipe joint according to claim 1, wherein
one of the first and second members is a valve body having an inlet and an outlet for a fluid, and the outer cylindrical end portion of the other of the first and second members is welded to either the inlet or the outlet.

8. The fluid control device according to claim 7, wherein the valve body is a body of a block valve in which a flow passage is bored to be in communication with a plurality of valve chambers in which valve elements are arranged, respectively.

9. A fluid control unit including a fluid control device according to claim 8.

10. A semiconductor fabrication apparatus including a fluid control unit according to claim 9.

11. A method of forming a pipe joint comprising
a first member having a first outer cylindrical end portion at an end and a first pressing portion located inside the first outer cylindrical end portion, a second member having a second outer cylindrical end portion at an end and a second pressing portion located inside the second outer cylindrical end portion, a fluid flow passage formed to extend at least either inside the first pressing portion or inside the second pressing portion, and a heat transmission suppressing member arranged inside the first and the second members assembled, the method comprising:

forming a weld experiencing transverse contraction and joining the first and the second outer cylindrical end portions, by butting the first and the second outer cylindrical end portions with their end faces meeting over the entire circumference and performing welding at the outer circumferential edge of the meeting end faces, the transverse contraction of the weld causing the first and second pressing portions to be displaced toward each other, thereby producing an annular sealed area between the first and the second pressing portions, and the heat transmission suppressing member suppressing transmission of heat applied in welding from a weld forming area to a to-be-sealed area in a space delimited by the weld forming area and the to-be-sealed area.

12. The method according to claim 11, wherein the weld is formed with the second outer cylindrical end portion pressed against the first outer cylindrical end portion.

13. The method according to claim 11, wherein the weld is formed in a manner such that first, point welds are formed at two points which are on a contact circle defined by the outer circumferential edge of the meeting end faces and opposite with respect to the center of the contact circle, and then the weld is formed by performing welding over the entire circumference of the contact circle.

14. The method according to claim 13, wherein the weld is formed in a manner such that after the point welds are formed at the two points which are on the contact circle and opposite with respect to the center of the contact circle, point welds are formed at two points which are on the contact circle and 90° apart from the former two points, respectively, and then the weld is formed by performing welding over the entire circumference of the contact circle.

* * * * *